US012757479B2

(12) United States Patent
Kamimura et al.

(10) Patent No.: US 12,757,479 B2
(45) Date of Patent: Oct. 6, 2026

(54) SEMICONDUCTOR DEVICE

(71) Applicant: FUJI ELECTRIC CO., LTD., Kanagawa (JP)

(72) Inventors: Kazuki Kamimura, Matsumoto-city (JP); Toshiyuki Matsui, Matsumoto-city (JP); Tatsuya Naito, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 575 days.

(21) Appl. No.: 18/322,603

(22) Filed: May 24, 2023

(65) Prior Publication Data

US 2024/0014207 A1 Jan. 11, 2024

(30) Foreign Application Priority Data

Jul. 11, 2022 (JP) ................................ 2022-111146

(51) Int. Cl.
*H10D 84/60* (2025.01)
*H10D 8/00* (2025.01)
(Continued)

(52) U.S. Cl.
CPC ........... *H10D 84/617* (2025.01); *H10D 8/422* (2025.01); *H10D 12/038* (2025.01); *H10D 12/481* (2025.01); *H10D 62/393* (2025.01); *H10D 64/117* (2025.01); *H10P 30/204* (2026.01); *H10P 30/21* (2026.01); *H10P 30/22* (2026.01)

(58) Field of Classification Search
CPC .... H10D 84/617; H10D 8/422; H10D 12/038; H10D 12/481; H10D 62/393; H10D 64/117; H10D 62/128; H10D 64/519; H10D 62/127; H10D 62/142; H10D 64/23;
(Continued)

(56) References Cited

U.S. PATENT DOCUMENTS

2010/0090248 A1 4/2010 Kono
2010/0156506 A1 6/2010 Tsuzuki
(Continued)

FOREIGN PATENT DOCUMENTS

JP H11274516 A 10/1999
JP 2003224281 A 8/2003
(Continued)

OTHER PUBLICATIONS

Office Action issued for counterpart Japanese Application No. 2022-111146, transmitted from the Japanese Patent Office on Mar. 10, 2026 (drafted on Mar. 4, 2026).

*Primary Examiner* — Mohammad A Rahman

(57) ABSTRACT

There is provided a semiconductor device that includes a diode portion, the semiconductor device including: a drift region of a first conductivity type provided in a semiconductor substrate; an anode region of a second conductivity type provided to be closer to a front surface side of the semiconductor substrate than the drift region; and a trench contact portion provided at a front surface of the semiconductor substrate in the diode portion, in which in a depth direction of the semiconductor substrate, a doping concentration of the anode region at a same depth as that of a bottom portion of the trench contact portion is 1E16 $cm^{-3}$ or more and 1E17 $cm^{-3}$ or less.

15 Claims, 11 Drawing Sheets

(51) Int. Cl.

| | |
|---|---|
| ***H10D 12/00*** | (2025.01) |
| ***H10D 12/01*** | (2025.01) |
| ***H10D 62/17*** | (2025.01) |
| ***H10D 64/00*** | (2025.01) |
| ***H10P 30/20*** | (2026.01) |
| ***H10P 30/22*** | (2026.01) |

(58) Field of Classification Search

CPC ............. H10D 84/811; H10D 84/0112; H10D 84/038; H10P 30/204; H10P 30/21; H10P 30/22

See application file for complete search history.

(56) References Cited

U.S. PATENT DOCUMENTS

| | | | | |
|---|---|---|---|---|
| 2015/0179637 | A1 | 6/2015 | Pfirsch | |
| 2016/0240641 | A1 | 8/2016 | Ogawara | |
| 2017/0162560 | A1 | 6/2017 | Takahashi | |
| 2021/0050345 | A1* | 2/2021 | Tamura | H10D 8/60 |
| 2021/0234027 | A1 | 7/2021 | Yoshida | |
| 2022/0328669 | A1 | 10/2022 | Mitsuzuka | |

FOREIGN PATENT DOCUMENTS

| | | | |
|---|---|---|---|
| JP | 2010118642 | A | 5/2010 |
| JP | 2010171385 | A | 8/2010 |
| JP | 2012156564 | A | 8/2012 |
| JP | 2015090917 | A | 5/2015 |
| WO | 2016030966 | A1 | 3/2016 |
| WO | 2020213254 | A1 | 10/2020 |
| WO | 2022004084 | A1 | 1/2022 |

* cited by examiner a–a'

SEMICONDUCTOR DEVICE

The contents of the following Japanese patent application(s) are incorporated herein by reference:

NO. 2022-111146 filed in JP on Jul. 11, 2022

BACKGROUND

1. Technical Field

The present invention relates to a semiconductor device.

2. Related Art

Patent Document 1 discloses that "the n-type impurity concentration rises as proceeds from the top surface (a position at an upper end of FIG. 2) of the semiconductor substrate 12 to a deeper position and takes a maximum value A1 in the pillar region 24".

PRIOR ART DOCUMENT

Patent Document

Patent Document 1: Japanese Patent Application Publication No. 2015-090917

Patent Document 2: International Publication No. WO 2016/030966

DESCRIPTION OF EXEMPLARY EMBODIMENTS

Figure 1:
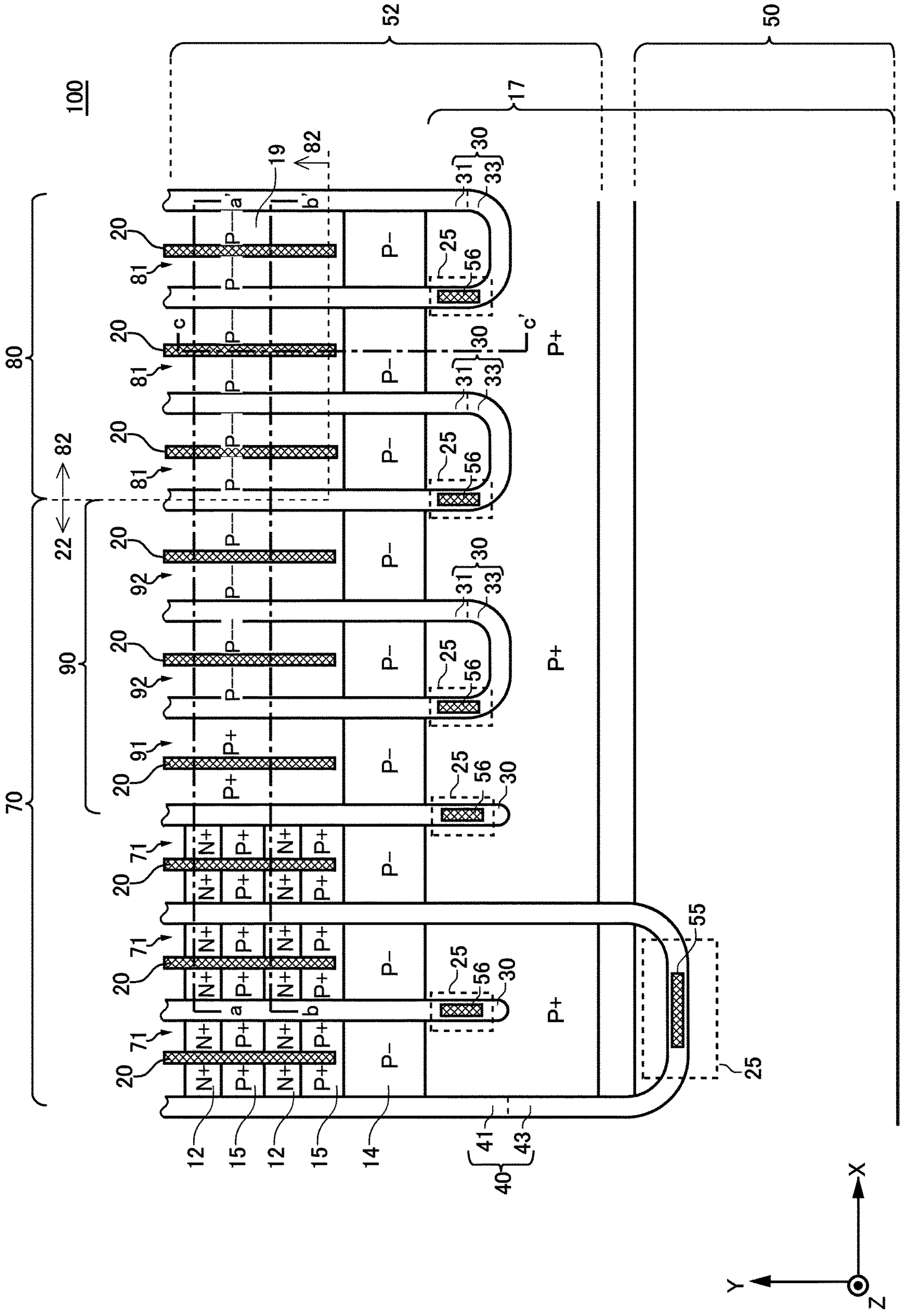
FIG. 1 shows an example of a top plan view of a semiconductor device 100.

Hereinafter, an embodiment of the present invention will be described, but the embodiment does not limit the invention according to the claims. In addition, not all of the combinations of features described in the embodiments are essential for a solving means of the invention.

In the present specification, one side in a direction parallel to a depth direction of a semiconductor substrate is referred to as an "upper" side, and the other side is referred to as a "lower" side. One surface of two principal surfaces of a substrate, a layer, or another member is referred to as an upper surface, and the other surface is referred to as a lower surface. "Upper", "lower", "front", and "back" directions are not limited to a direction of gravity, or a direction of an attachment to a substrate or the like when a semiconductor device is mounted.

In the present specification, technical matters may be described by using orthogonal coordinate axes of an X axis, a Y axis, and a Z axis. The orthogonal coordinate axes are merely for specifying relative positions of components, and are not for putting a limitation to indicate a specific direction. For example, the Z axis is not limited to indicate a height direction with respect to the ground. It should be noted that a +Z axis direction and a −Z axis direction are directions opposite to each other. In a case where a Z axis direction is described without a description of positive and negative signs, the direction means a direction parallel to the +Z axis and the −Z axis.

In the present specification, a plane parallel to the upper surface of the semiconductor substrate is referred to as an XY plane, and orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. The depth direction of the semiconductor substrate may be referred to as the Z axis. It should be noted that in the present specification, in a case where the semiconductor substrate is viewed in the Z axis direction, the view is referred to as a plan view. In addition, in the present specification, a direction parallel to the upper surface and the lower surface of the semiconductor substrate may be referred to as a horizontal direction, including an X axis direction and a Y axis direction.

Each example embodiment shows an example in which a first conductivity type is set as an N type, and a second conductivity type is set as a P type; however, the first conductivity type may be the P type, and the second conductivity type may be the N type. In this case, conductivity types of the substrate, the layer, a region, and the like in each example embodiment respectively have opposite polarities.

In the present specification, in a case where a phrase as "same" or "equal" is mentioned, the case may include a case where there is an error due to a variation in manufacturing or the like. The error is, for example, within 10%.

In the present specification, a conductivity type of a doping region where doping has been carried out with an impurity is described as the P type or the N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor showing a conductivity type of the N type, or a semiconductor showing a conductivity type of the P type.

In the present specification, a doping concentration means a concentration of the donor or a concentration of the acceptor in a thermal equilibrium state.

In the present specification, a description of a P+ type or an N+ type means a doping concentration higher than that of the P type or the N type, and a description of a P− type or an N− type means a doping concentration lower than that of the P type or the N type. In addition, in the present specification, a description of a P++ type or an N++ type means a higher doping concentration than that of the P+ type or the N+ type.

FIG. 1 shows an example of a top plan view of a semiconductor device 100. The semiconductor device 100 of the present example is a semiconductor chip including a transistor portion 70 and a diode portion 80. For example, the semiconductor device 100 is a reverse conducting IGBT (RC-IGBT: Reverse Conducting IGBT). The transistor portion 70 of the present example includes a boundary portion 90 in a part adjacent to the diode portion 80.

The transistor portion 70 is a region where a collector region 22 provided on a back surface side of a semiconductor substrate 10 is projected onto an upper surface of the semiconductor substrate 10. The collector region 22 will be described below. The transistor portion 70 includes a transistor such as an IGBT.

The diode portion 80 is a region where a cathode region 82 provided on a back surface of the semiconductor substrate 10 is projected onto the upper surface of the semiconductor substrate 10. The cathode region 82 has the first conductivity type. The cathode region 82 of the present example is of the N+ type as an example. The diode portion 80 includes a diode such as a freewheeling diode (FWD: Free Wheel Diode) provided to be adjacent to the transistor portion 70 at the upper surface of the semiconductor substrate 10.

FIG. 1 shows a region around a chip end portion which is an edge side of the semiconductor device 100, and omits another region. For example, an edge termination structure portion may be provided in a region on a negative side of the Y axis direction in the semiconductor device 100 of the present example. The edge termination structure portion relaxes an electric field concentration in an upper surface side of the semiconductor substrate 10. The edge termination structure portion has, for example, a structure of a guard ring, a field plate, a RESURF, and a combination of these. It should be noted that the present example describes an edge on the negative side in the Y axis direction for convenience. However, the other edge of the semiconductor device 100 is similar. The edge termination structure portion may be provided to surround an active region including the transistor portion 70 and the diode portion 80.

The semiconductor substrate 10 may be a silicon substrate, may be a silicon carbide substrate, or may be a nitride semiconductor substrate or the like of gallium nitride or the like. The semiconductor substrate 10 of the present example is the silicon substrate.

The semiconductor device 100 of the present example includes a gate trench portion 40, a dummy trench portion 30, an emitter region 12, a base region 14, a contact region 15, a well region 17, an anode region 19, and a trench contact portion 20, at a front surface 21 of the semiconductor substrate 10. The front surface 21 will be described below. In addition, the semiconductor device 100 of the present example includes an emitter electrode 52 and a gate metal layer 50 which are provided above the front surface 21 of the semiconductor substrate 10.

The emitter electrode 52 is provided above the gate trench portion 40, the dummy trench portion 30, the emitter region 12, the base region 14, the contact region 15, the well region 17, the anode region 19, and the trench contact portion 20. In addition, the gate metal layer 50 is provided above the gate trench portion 40 and the well region 17.

The emitter electrode 52 and the gate metal layer 50 are formed of a material containing metal. At least a part of a region of the emitter electrode 52 may be formed of metal such as aluminum (Al), or an alloy containing aluminum, for example, a metal alloy such as an aluminum-silicon alloy (AlSi) and an aluminum-silicon-copper alloy (AlSiCu). At least a part of a region of the gate metal layer 50 may be formed of metal such as aluminum (Al), or an alloy containing aluminum, for example, a metal alloy such as an aluminum-silicon alloy (AlSi) and an aluminum-silicon-copper alloy (AlSiCu). The emitter electrode 52 and the gate metal layer 50 may have barrier metal formed of titanium, a titanium compound, or the like in a lower layer of a region formed of aluminum or an alloy containing aluminum, or the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1. The trench contact portion 20, a contact hole 55, and a contact hole 56 are provided to pass through the interlayer dielectric film 38.

The trench contact portion 20 is provided to extend from an upper surface of the interlayer dielectric film 38 in the depth direction of the semiconductor substrate 10. The trench contact portion 20 has a bottom portion and a side portion. The trench contact portion 20 electrically connects the emitter electrode 52 and the semiconductor substrate 10. The trench contact portion 20 is provided to extend in a trench extension direction. The trench contact portion 20 of the present example is arranged in a stripe shape along the gate trench portion 40 and the dummy trench portion 30.

The trench contact portion 20 is formed at an upper surface of each region of the emitter region 12 and the contact region 15 in the transistor portion 70. The trench contact portion 20 is not provided above the well regions 17 provided at both ends in the Y axis direction. In this way, one or more trench contact portions 20 are formed in an interlayer dielectric film. The one or more trench contact portions 20 may be provided to extend in the extension direction.

The trench contact portion 20 is also provided above the anode region 19 in the diode portion 80. The trench contact portion 20 is provided on upper surfaces of the contact region 15 and the anode region 19 in the boundary portion 90. None of the trench contact portions 20 is provided above the well regions 17 provided at both ends in the Y axis direction.

The contact hole 55 connects the gate metal layer 50 and a gate conductive portion in the transistor portion 70. In the contact hole 55, a plug formed of tungsten or the like may be formed via the barrier metal.

The contact hole 56 connects the emitter electrode 52 and a dummy conductive portion in the dummy trench portion 30. In the contact hole 56, a plug formed of tungsten or the like may be formed via the barrier metal.

A connection portion 25 electrically connects a front surface side electrode such as the emitter electrode 52 or the gate metal layer 50, and the semiconductor substrate 10. In an example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. Here, the connection portion 25 of the present example is formed of polysilicon (N+) doped with the impurities of the N type. The connection portion 25 is provided above the front surface 21 of the semiconductor substrate 10 via a dielectric film such as an oxide film, or the like.

The gate trench portion 40 is arrayed at a predetermined interval along a predetermined array direction (the X axis direction in the present example). The gate trench portion 40 of the present example may have: two extension parts 41 that extend along the extension direction (the Y axis direction in the present example) which is parallel to the front surface 21 of the semiconductor substrate 10 and which is perpendicular to the array direction; and a connection part 43 that connects the two extension parts 41.

It is preferable that at least a part of the connection part 43 is formed in a curved shape. By connecting end portions of the two extension parts 41 of the gate trench portion 40, it is possible to relax electric field concentrations at the end portions of the extension parts 41. At the connection part 43 of the gate trench portion 40, the gate metal layer 50 may be connected to the gate conductive portion.

The dummy trench portion 30 is a trench portion electrically connected to the emitter electrode 52. The dummy trench portion 30 is arrayed, similarly to the gate trench portion 40, at a predetermined interval along a predetermined array direction (the X axis direction in the present example). Similarly to the gate trench portion 40, the dummy trench portion 30 of the present example may have, a U shape at the front surface 21 of the semiconductor substrate 10. That is, the dummy trench portion 30 may have two extension parts 31 which extend along the extension direction, and a connection part 33 which connects the two extension parts 31.

The transistor portion 70 of the present example has a structure in which one gate trench portion 40 and one dummy trench portion 30 are repeatedly arrayed. That is, the transistor portion 70 of the present example has the gate trench portion 40 and the dummy trench portion 30 at a ratio of 1:1. For example, the transistor portion 70 has one extension part 31 between two extension parts 41. In addition, the transistor portion 70 has one extension part 41 between two extension parts 31.

Note that the ratio of the gate trench portion 40 and the dummy trench portion 30 is not limited to that of the present example. The ratio of the gate trench portion 40 and the dummy trench portion 30 may be 2:3, or may be 2:4. In addition, the transistor portion 70 may have all of the trench portions as the gate trench portions 40 without having the dummy trench portion 30.

The well region 17 is a region of the second conductivity type provided to be closer to a front surface 21 side of the semiconductor substrate 10 than a drift region 18 which will be described below. The well region 17 is an example of a well region provided in the edge side of the semiconductor device 100. The well region 17 is of the P+ type as an example. The well region 17 is formed in a predetermined range from an end portion of an active region of a side on which the gate metal layer 50 is provided. A diffusion depth of the well region 17 may be deeper than depths of the gate trench portion 40 and the dummy trench portion 30. Parts of regions of the gate trench portion 40 and the dummy trench portion 30 on a gate metal layer 50 side are formed in the well region 17. Bottoms of ends of the gate trench portion 40 and the dummy trench portion 30 in the extension direction may be covered with the well region 17.

A mesa portion 71 is a mesa portion provided to be adjacent to the trench portion in a plane parallel to the front surface 21 of the semiconductor substrate 10. The mesa portion is a part of the semiconductor substrate 10 interposed between two trench portions adjacent to each other, and may be a part ranging from the front surface 21 of the semiconductor substrate 10 to a depth of a deepest bottom portion of each trench portion. The extension part of each trench portion may be set as one trench portion. That is, a region interposed between two extension parts may be set as the mesa portion.

The mesa portion 71 is provided to be adjacent to at least one of the dummy trench portion 30 or the gate trench portion 40 in the transistor portion 70. The mesa portion 71 has the well region 17, the emitter region 12, the base region 14, and the contact region 15, at the front surface 21 of the semiconductor substrate 10. In the mesa portion 71, the emitter region 12 and the contact region 15 are alternately provided in the extension direction.

The base region 14 is a region of the second conductivity type provided in the front surface 21 side of the semiconductor substrate 10. The base region 14 is of the P− type as an example. The base regions 14 may be provided at both end portions of the mesa portion 71, in the Y axis direction, at the front surface 21 of the semiconductor substrate 10. It should be noted that FIG. 1 shows only one end portion of the base region 14 in the Y axis direction.

The emitter region 12 is a region of the first conductivity type which is provided at the front surface 21 of the semiconductor substrate 10 and which has a doping concentration higher than that of the drift region 18. The emitter region 12 of the present example is of the N+ type as an example. An example of the dopant of the emitter region 12 is arsenic (As). The emitter region 12 is provided in contact with the gate trench portion 40 at the front surface 21 of the mesa portion 71. The emitter region 12 may be provided to extend in the X axis direction from one trench portion to the other trench portion of two trench portions which interpose the mesa portion 71 therebetween.

In addition, the emitter region 12 may be, or may not be in contact with the dummy trench portion 30. The emitter region 12 of the present example is in contact with the dummy trench portion 30.

The contact region 15 is a region of the second conductivity type which has a doping concentration higher than that of the base region 14. The contact region 15 of the present example is of the P+ type as an example. The contact region 15 of the present example is provided at the front surface 21 of the mesa portion 71. The contact region 15 may be provided in the X axis direction from one trench portion to the other trench portion of two trench portions which interpose the mesa portion 71 therebetween. The contact region 15 may be, or may not be in contact with the gate trench portion 40 or the dummy trench portion 30. The contact region 15 of the present example is in contact with the dummy trench portion 30 and the gate trench portion 40.

The boundary portion 90 is a region which is provided in the transistor portion 70 and which is adjacent to the diode portion 80. The boundary portion 90 may not have the emitter region 12. In an example, the trench portion in the boundary portion 90 is the dummy trench portion 30. The boundary portion 90 of the present example is arranged such that both ends in the X axis direction are the dummy trench portions 30. At least one of the dummy trench portions 30 in the boundary portion 90 may be set to a potential different from a gate potential.

A mesa portion 91 is provided in the boundary portion 90. The mesa portion 91 has the contact region 15 at the front surface 21 of the semiconductor substrate 10. The mesa portion 91 of the present example has the base region 14 and the well region 17 on the negative side of the Y axis direction.

A mesa portion 92 is provided in the boundary portion 90. The mesa portion 92 has the anode region 19 at the front surface 21 of the semiconductor substrate 10. The mesa portion 92 of the present example has the anode region 19 and the well region 17 on the negative side of the Y axis direction.

A mesa portion 81 is provided in a region interposed between the dummy trench portions 30 adjacent to each other in the diode portion 80. The mesa portion 81 has the anode region 19 at the front surface 21 of the semiconductor substrate 10. The mesa portion 81 of the present example has the anode region 19 and the well region 17 on the negative side of the Y axis direction.

The anode region 19 is a region of the second conductivity type. A doping concentration of the anode region 19 may be lower than the doping concentration of the base region 14. The anode region 19 of the present example is of a P−− type as an example. The anode region 19 of the present example is provided at the front surface 21 of the mesa portion 91. The anode region 19 may be provided in the X axis direction from one dummy trench portion 30 to the other dummy trench portion 30 of two dummy trench portions 30 which interpose the mesa portion 81 therebetween. The anode region 19 may be, or may not be in contact with the dummy trench portion 30. The anode region 19 of the present example is in contact with the dummy trench portion 30.

The doping concentration of the anode region 19 of the present example may be 1E16 $cm^{-3}$ or more and 1E17 $cm^{-3}$ or less. It should be noted that E means a power of 10, and for example, 1E16 $cm^{-3}$ means $1\times10^{16}$ $cm^{-3}$. The anode region 19 may have a peak of the doping concentration in the depth direction of the semiconductor substrate 10. In addition, in the depth direction of the semiconductor substrate 10, a lower end of the anode region 19 may have the same depth as a lower end of the base region 14, or may be at a deeper position than that of the lower end of the base region 14. A thickness of the anode region 19 may be 0.6 μm or more and 3 μm or less in the depth direction of the semiconductor substrate 10.

Figure 2A:
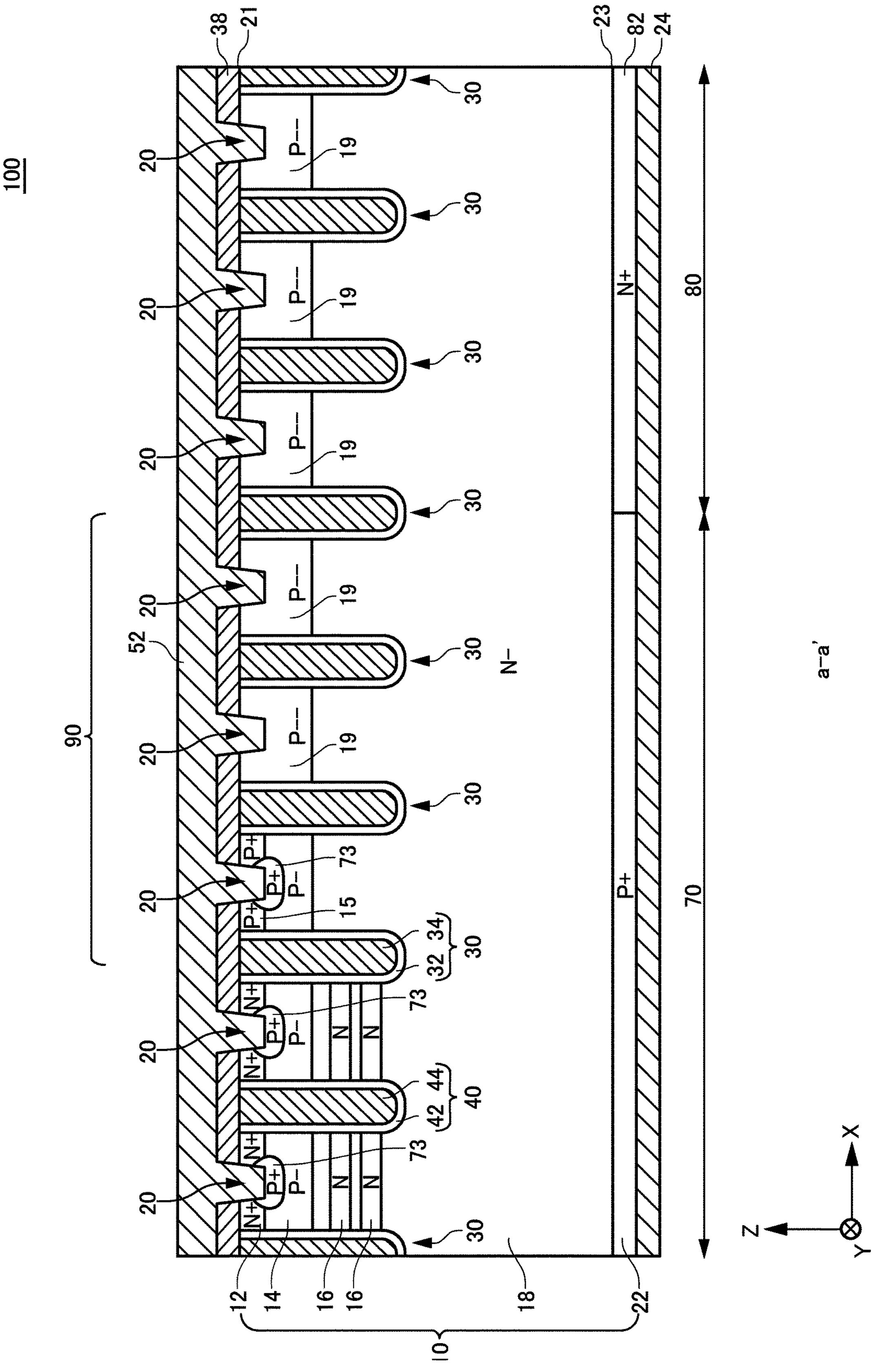
FIG. 2A shows an example of a cross section a-a' in FIG. 1.

FIG. 2A is an example of a cross section a-a' in FIG. 1. The cross section a-a' is an XZ plane, in the transistor portion 70 and the diode portion 80, which does not pass through a diode plug region 83 that will be described below. In the cross section a-a', the semiconductor device 100 of the present example has the semiconductor substrate 10, the interlayer dielectric film 38, the emitter electrode 52, and a collector electrode 24. The emitter electrode 52 is formed above the semiconductor substrate 10 and the interlayer dielectric film 38.

The drift region 18 is a region of the first conductivity type provided in the semiconductor substrate 10. The drift region 18 of the present example is of the N− type as an example. The drift region 18 may be a remaining region where another doping region is not formed in the semiconductor substrate 10. That is, the doping concentration of the drift region 18 may be a doping concentration of the semiconductor substrate 10.

The collector region 22 is provided on a back surface 23 of the semiconductor substrate in the transistor portion 70. The collector region 22 is a region of the second conductivity type which has a doping concentration higher than that of the base region 14. The collector region 22 of the present example is of the P+ type as an example.

The cathode region 82 is provided on the back surface 23 of the semiconductor substrate in the diode portion 80. The cathode region 82 is a region of the first conductivity type which has a higher doping concentration than that of the drift region 18. The cathode region 82 of the present example is of the N+ type as an example.

A boundary between the collector region 22 and the cathode region 82 is a boundary between the transistor portion 70 and the diode portion 80. That is, the collector region 22 is provided below the boundary portion 90 of the present example. In addition, the cathode region 82 may have a first cathode portion 181 and a second cathode portion 182 which will be described below in detail.

The collector electrode 24 is formed on the back surface 23 of the semiconductor substrate 10. The collector electrode 24 is formed of a conductive material such as metal.

The base region 14 is a region of the second conductivity type provided above the drift region 18. The doping concentration of the base region 14 may be higher than the doping concentration of the anode region 19. The doping concentration of the base region 14 may be 3E16 $cm^{-3}$ or more and 1E18 $cm^{-3}$ or less. The base region 14 may be provided below the emitter region 12. The base region 14 is provided in contact with the gate trench portion 40. The base region 14 may be provided in contact with the dummy trench portion 30.

An accumulation region 16 is a region of the first conductivity type which is provided to be closer to the front surface 21 side of the semiconductor substrate 10 than the drift region 18. The accumulation region 16 of the present example is of the N type as an example. The accumulation region 16 is provided in the transistor portion 70, and is not provided in the diode portion 80 and the boundary portion 90. Note that the accumulation region 16 may be provided in both of the transistor portion 70 and the diode portion 80. Providing the accumulation region 16 makes it possible to enhance a carrier injection enhancement effect (IE effect) to reduce an ON voltage of the transistor portion 70.

One or more gate trench portions 40 and one or more dummy trench portions 30 are provided at the front surface 21. Each trench portion is provided from the front surface 21 to the drift region 18. In a region provided with at least any of the emitter region 12, the base region 14, the contact region 15, the accumulation region 16, or the anode region 19, each trench portion also passes through these regions to reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

The gate trench portion 40 has a gate trench, a gate dielectric film 42, and a gate conductive portion 44 which are formed at the front surface 21. The gate dielectric film 42 is formed to cover an inner wall of the gate trench. The gate dielectric film 42 may be formed by oxidizing or nitriding a semiconductor on the inner wall of the gate trench. The gate conductive portion 44 is formed on an inner side further than the gate dielectric film 42 in the gate trench. The gate dielectric film 42 insulates the gate conductive portion 44 from the semiconductor substrate 10. The gate conductive portion 44 is formed of a conductive material such as polysilicon. The gate trench portion 40 is covered with the interlayer dielectric film 38 at the front surface 21.

The gate conductive portion 44 includes a region facing the base region 14 adjacent on a mesa portion 71 side with the gate dielectric film 42 interposed therebetween, in the depth direction of the semiconductor substrate 10. When a predetermined voltage is applied to the gate conductive portion 44, a channel is formed by an inversion layer of electrons on a surface layer in the base region 14 at an interface in contact with the gate trench.

The dummy trench portion 30 may have the same structure as that of the gate trench portion 40. The dummy trench portion 30 has a dummy trench, a dummy dielectric film 32, and a dummy conductive portion 34 which are formed in the front surface 21 side. The dummy dielectric film 32 is formed to cover an inner wall of the dummy trench. The dummy conductive portion 34 is formed in the dummy trench, and is formed on an inner side further than the dummy dielectric film 32. The dummy dielectric film 32 insulates the dummy conductive portion 34 from the semiconductor substrate 10. The dummy trench portion 30 is covered by the interlayer dielectric film 38 at the front surface 21.

The interlayer dielectric film 38 is provided on the front surface 21. The emitter electrode 52 is provided above the interlayer dielectric film 38. The interlayer dielectric film 38 is provided with one or more trench contact portions 20 to electrically connect the emitter electrode 52 and the semiconductor substrate 10. Similarly to the trench contact portion 20, the contact hole 55 and the contact hole 56 may also be provided to pass through the interlayer dielectric film 38.

The trench contact portion 20 reaches the base region 14 or the anode region 19 through the interlayer dielectric film 38. The trench contact portion 20 electrically connects the emitter electrode 52 and the semiconductor substrate 10. A depth of a lower end of the trench contact portion 20 may be 0.3 μm or more and 0.6 μm or less from the front surface 21 of the semiconductor substrate 10.

A transistor plug region 73 is a region of the second conductivity type which is provided below the bottom portion of the trench contact portion 20 in the transistor portion 70 and which has a doping concentration higher than that of the base region 14. The doping concentration of the transistor plug region 73 may be 1E21 $cm^{-3}$ or more and 1E22 $cm^{-3}$ or less. The transistor plug region 73 of the present example is of the P+ type as an example. The transistor plug region 73 may be provided to partially cover the bottom portion and a side wall of the trench contact portion 20.

The doping concentration of the transistor plug region 73 may be higher than the doping concentration of the contact region 15. In addition, the doping concentration of the transistor plug region 73 may be the same as the doping concentration of the contact region 15.

The transistor plug regions 73 are continuously provided in the trench extension direction in the mesa portion 71 and the mesa portion 91. That is, the transistor plug regions 73 are provided in a stripe shape in the mesa portion 71 and the mesa portion 91. Providing the transistor plug region 73 makes it possible to lower a resistance of the bottom portion of the trench contact portion 20 in the transistor portion 70, and to suppress a latch-up destruction.

Figure 2B:
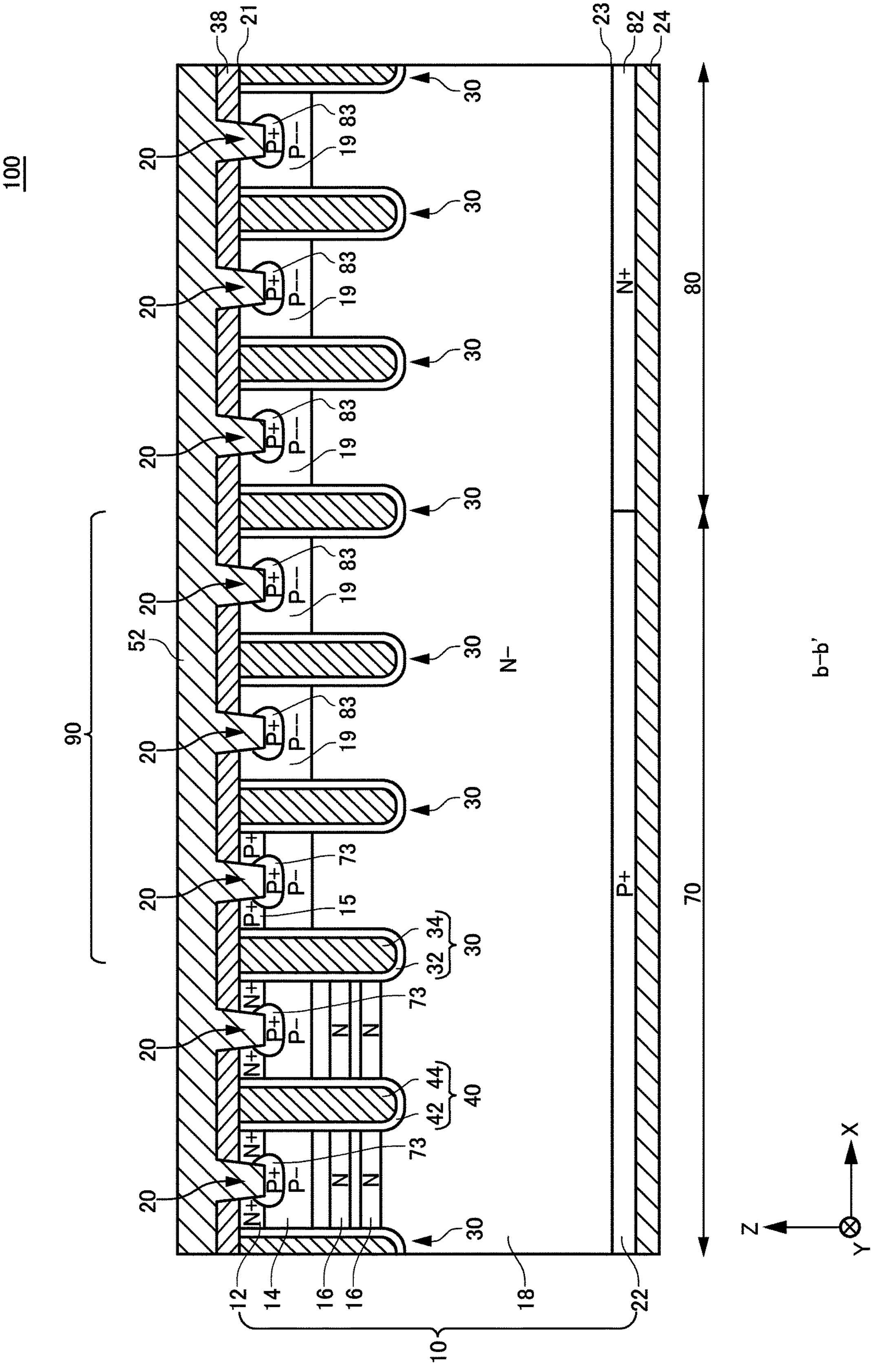
FIG. 2B shows an example of a cross section b-b' in FIG. 1.

FIG. 2B is an example of a cross section b-b' in FIG. 1. The cross section b-b' is the XZ plane, in the transistor portion 70 and the diode portion 80, which passes through the diode plug region 83. The configuration included in the cross section b-b' may be the same as that of the cross section a-a' except for the diode plug region 83.

The diode plug region 83 is a region of the second conductivity type which is provided below the bottom portion of the trench contact portion 20 in the diode portion 80 and which has a doping concentration higher than that of the anode region 19. The doping concentration of the diode plug region 83 may be 1E21 $cm^{-3}$ or more and 1E22 $cm^{-3}$ or less. The doping concentration of the diode plug region 83 may be the same as the doping concentration of the transistor plug region 73. The diode plug region 83 of the present example is of the P+ type as an example. The diode plug region 83 may be provided to partially cover the bottom portion and the side wall of the trench contact portion 20.

The diode plug regions 83 are selectively provided in the trench extension direction in the mesa portion 81 and the mesa portion 92. That is, the diode plug regions 83 are provided in a dot shape in the mesa portion 81 and the mesa portion 92. The diode plug regions 83 may be selectively provided at a regular interval in the trench extension direction.

Providing the diode plug region 83 makes it possible to lower a resistance of the bottom portion of the trench contact portion 20 in the diode portion 80, and to reduce a steady-state loss Vf. When the first cathode portion 181 and the second cathode portion 182 are provided in the cathode region 82 which will be described below, the steady-state loss Vf increases; however, adding the diode plug region 83 makes it possible to reduce a switching loss by lowering a value of the steady-state loss Vf increased by having the second cathode portion 182.

Figure 2C:
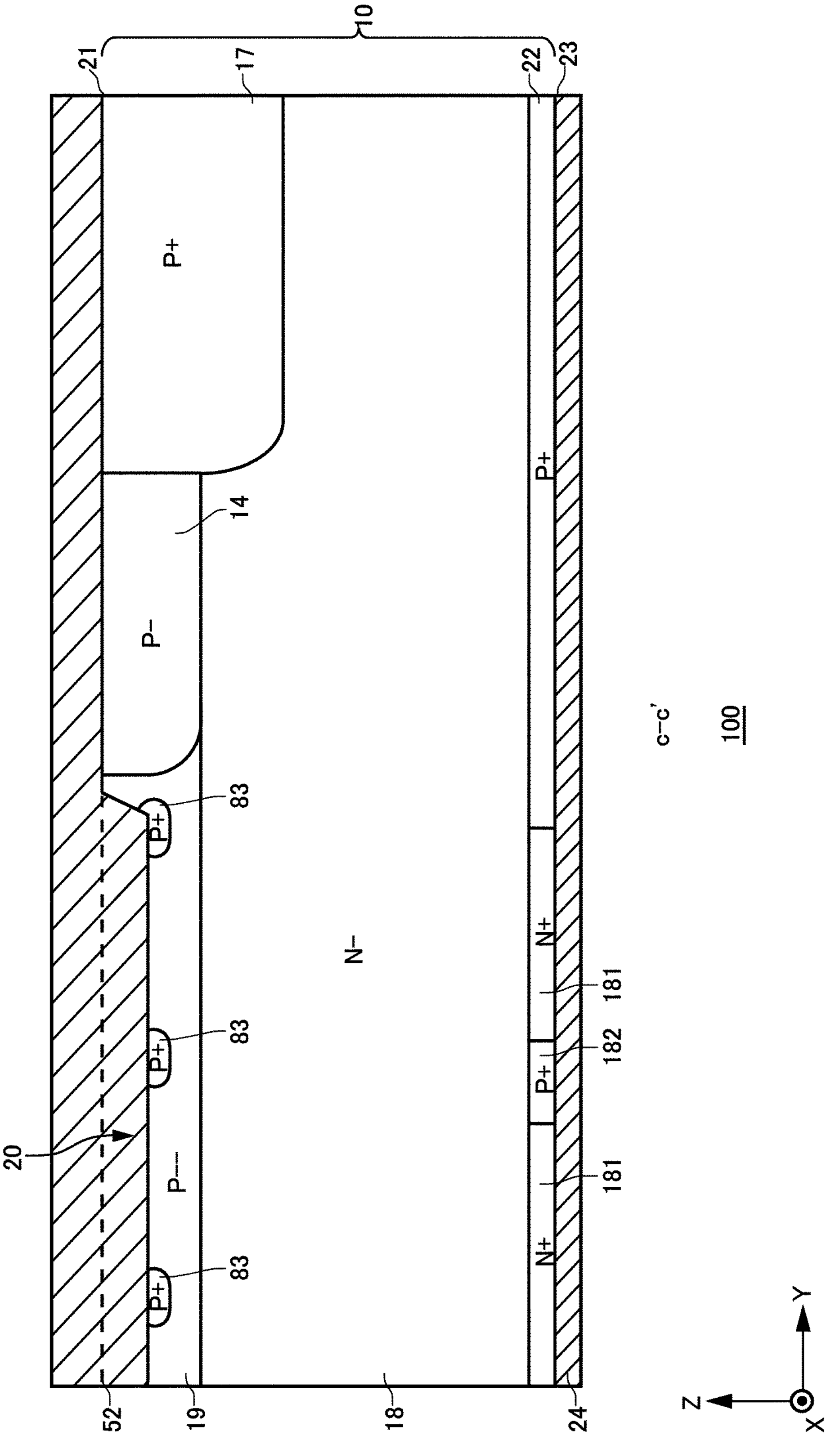
FIG. 2C shows an example of a cross section c-c' in FIG. 1.

FIG. 2C is an example of a cross section c-c' in FIG. 1. The cross section c-c' is a YZ plane passing through the center of a width of the trench contact portion 20 in the X axis direction in the diode portion 80. The semiconductor device 100 of the present example has the semiconductor substrate 10, the emitter electrode 52, and the collector electrode 24, in the cross section c-c'.

The first cathode portion 181 is a region of the first conductivity type which has a higher doping concentration than that of the drift region 18. In an example, the first cathode portion 181 is of the N+ type.

The second cathode portion 182 is a region of the second conductivity type provided to be adjacent to the first cathode portion 181 on the back surface 23 of the semiconductor substrate 10. That is, the second cathode portion 182 may be in direct contact with the first cathode portion 181. In an example, the second cathode portion 182 is of the P+ type.

The first cathode portion 181 may be formed, by an ion implantation step for forming the second cathode portion 182, and by an ion of the dopant of the P type being implanted and then an ion of the dopant of the N type being implanted. Conversely, the second cathode portion 182 may be formed, by an ion implantation step for forming the first cathode portion 181, and by an ion of the dopant of the N type being implanted and then an ion of the dopant of the P type being implanted.

The first cathode portion 181 and the second cathode portion 182 are arranged to form a boundary of a contact with each other. The first cathode portion 181 and the second cathode portion 182 may be alternately arranged in any direction. The first cathode portions 181 and the second cathode portion 182 of the present example are alternately arrayed in the trench extension direction (for example, the Y axis direction), but may be alternately arrayed in the trench array direction (for example, the X axis direction). The first cathode portion 181 and the second cathode portion 182 may be arranged in the stripe shapes in a top view. One of the first cathode portion 181 and the second cathode portion 182 may be formed in the dot shape.

The cathode region 82 in the diode portion 80 of the present example has the first cathode portion 181 and the second cathode portion 182 arranged to form the boundary of a contact with each other. Providing the first cathode portion 181 and the second cathode portion 182 in the cathode region 82 makes it possible to lower a surge voltage, to shorten a reverse recovery time of the diode portion, and to reduce a diode loss Err.

An end portion of the trench contact portion 20 may be covered with the diode plug region 83. The trench contact portion 20 is provided to extend in the trench extension direction, and is arranged in the stripe shape along the gate trench portion 40 and the dummy trench portion 30. The trench contact portion 20 which is provided in the diode portion 80 may be provided in the dot shape above the selectively provided diode plug region.

Figure 3A:
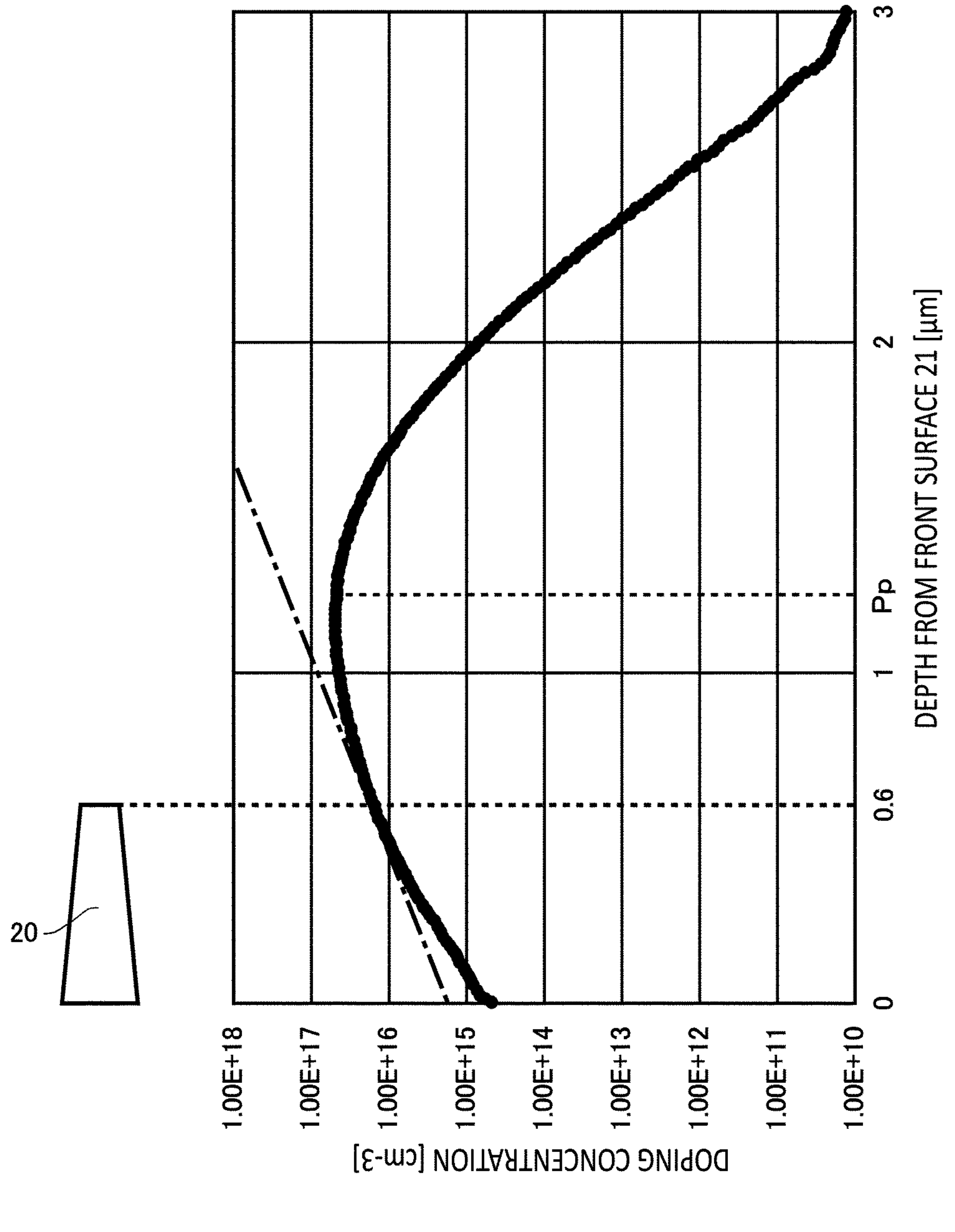
FIG. 3A shows an example of a profile of a doping concentration of a comparison example.

FIG. 3A is a graph showing the doping concentration of the anode region 19 in the semiconductor device 100 of the present example. It should be noted that FIG. 3A to FIG. 3D show doping concentrations in parts that do not include the diode plug region 83. A horizontal axis is a distance from the front surface 21 of the semiconductor substrate 10, and a vertical axis is a doping concentration. In addition, a schematic diagram of the trench contact portion 20 with a depth of 0.6 μm is shown above the graph as an example. In the semiconductor device 100 of the present example, a peak position Pp of the doping concentration is positioned at a location which is deeper than that in a semiconductor device 500 of the comparison example.

That is, in the semiconductor device 100 of the present example, the bottom portion of the trench contact portion may be positioned to be closer to the front surface 21 side than the peak position Pp of the doping concentration. The peak position Pp of the doping concentration may be deeper than the bottom portion of the trench contact portion 20 by 0.5 μm or more in the depth direction of the semiconductor substrate 10. At a depth position of the bottom portion of the trench contact portion 20, the doping concentration may have a positive slope. It should be noted that in the present specification, the term "slope of the doping concentration" may refer to, in a curve obtained by plotting the doping concentration with respect to the depth from the front surface 21, a slope of a tangent line of the curve at a depth equivalent to that of the bottom portion of the trench contact portion 20.

Figure 3B:
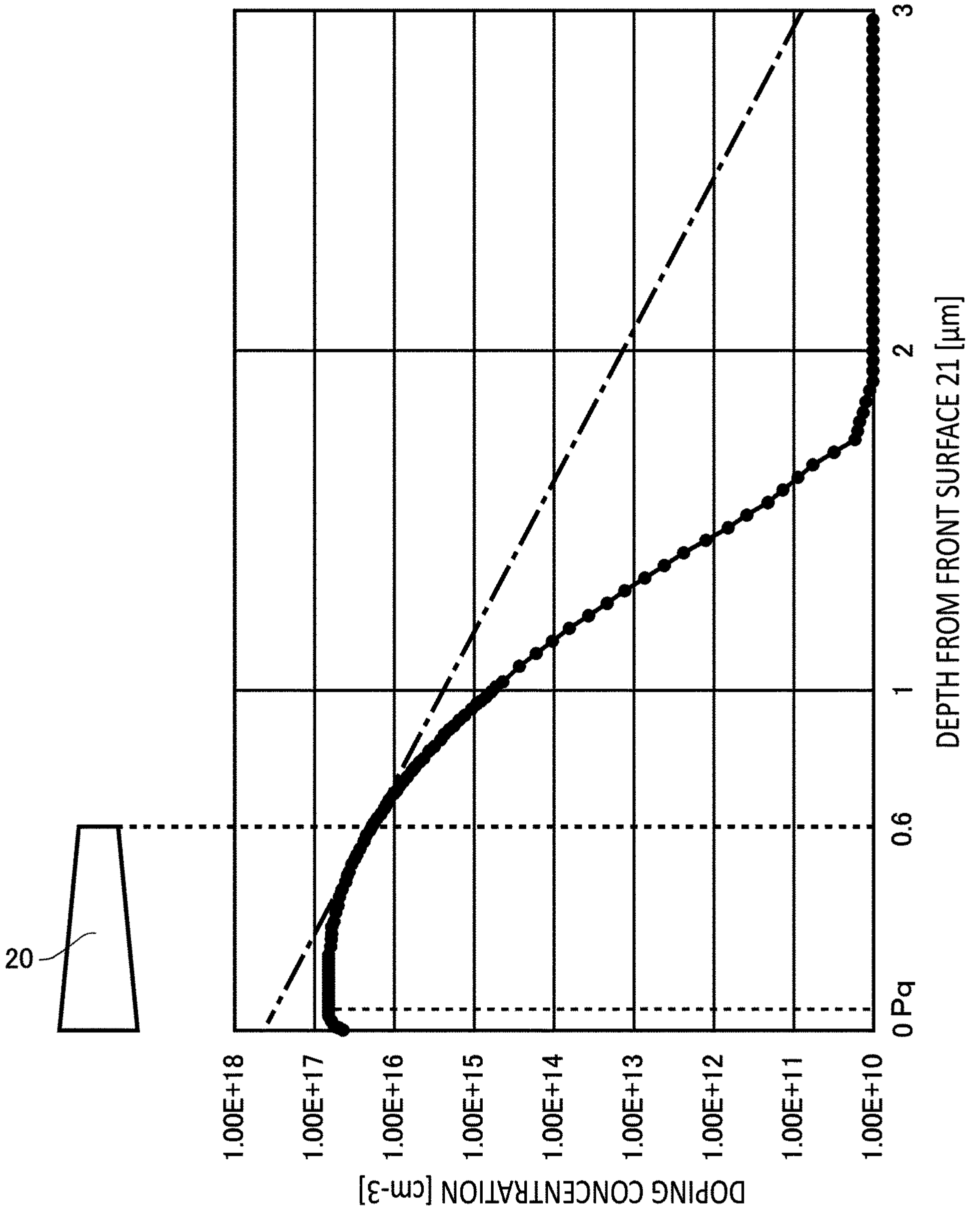
FIG. 3B shows an example of a profile of a doping concentration in the semiconductor device 100 of an example embodiment.

FIG. 3B is a graph showing the doping concentration of the anode region 19 in the semiconductor device 500 of the comparison example. The horizontal axis is the distance from the front surface 21 of the semiconductor substrate 10, and the vertical axis is the doping concentration. In addition, the schematic diagram of the trench contact portion 20 with a depth of 0.6 μm is shown above the graph as an example. In the drawing, a sign Pq is a peak position of the doping concentration in the semiconductor device 500 of the comparison example.

Figure 3C:
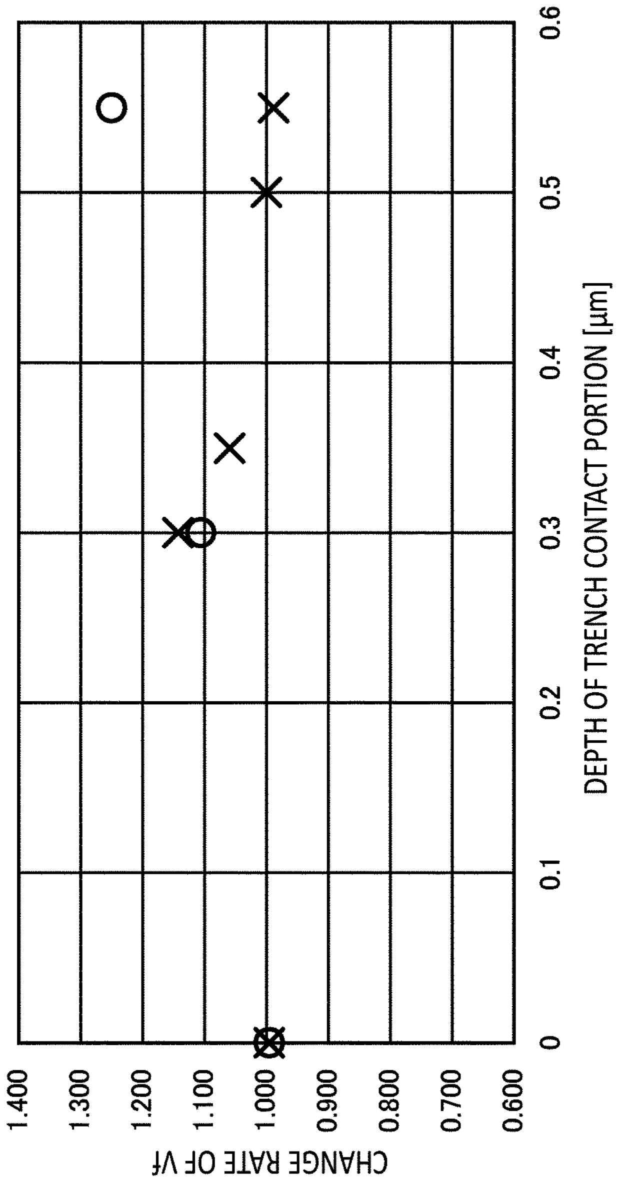
FIG. 3C shows examples of Vf change rates of the example embodiment and the comparison example.

FIG. 3C is a graph showing change rates of Vf, when the depth of the trench contact portion 20 is changed, in the semiconductor device 100 of the present example and the semiconductor device 500 of the comparison example. In the drawing, a white circle represents the change rate of Vf in the semiconductor device 500 of the comparison example, and a cross represents the change rate of Vf in the semiconductor device 100 of the present example.

An advantageous effect of the present example will be described below based on FIG. 3A to FIG. 3C.

With reference to FIG. 3C, it can be seen that in the semiconductor device 500 of the comparison example, the change rate of Vf becomes great as the depth of the trench contact portion 20 becomes deep. That is, Vf increases as the depth of the trench contact portion becomes deep. On the other hand, in the semiconductor device 100 of the present example, the change rate of Vf approaches 1 when the depth of the trench contact portion 20 becomes a certain value or more. That is, even when the depth of the trench contact portion 20 becomes deep, an advantageous effect that Vf does not increase, is exhibited.

Here, with reference to FIG. 3A, it can be seen that in the semiconductor device 100 of the present example, the slope of the doping concentration is positive at the depth equivalent to that of the bottom portion of the trench contact portion 20. In addition, the peak position Pp of the doping concentration exists at a position deeper than the bottom portion of the trench contact portion 20.

In the present example, it is found that an increase in the value of Vf is suppressed when the slope of the doping concentration is 4E16 $cm^{-3}/\mu m$ or more. It should be noted that in the present example, a depth of the bottom portion of the trench contact portion 20 at which the slope of the doping concentration is 4E16 $cm^{-3}/\mu m$ or more, is 0.3 μm or more and 0.6 μm or less as an example.

In addition, a value of the doping concentration at the depth equivalent to that of the bottom portion of the trench contact portion 20 is also a factor that determines the change rate of Vf. In the present example, when the doping concentration at the depth equivalent to that of the bottom portion of the trench contact portion 20 is 1E16 $cm^{-3}$ or more and 1E17 $cm^{-3}$ or less, the increase in the value of Vf is easily suppressed.

On the other hand, with reference to FIG. 3B, it can be seen that in the semiconductor device 500 of the comparison example, the slope of the doping concentration is negative at the depth equivalent to that of the bottom portion of the trench contact portion 20.

Figure 3D:
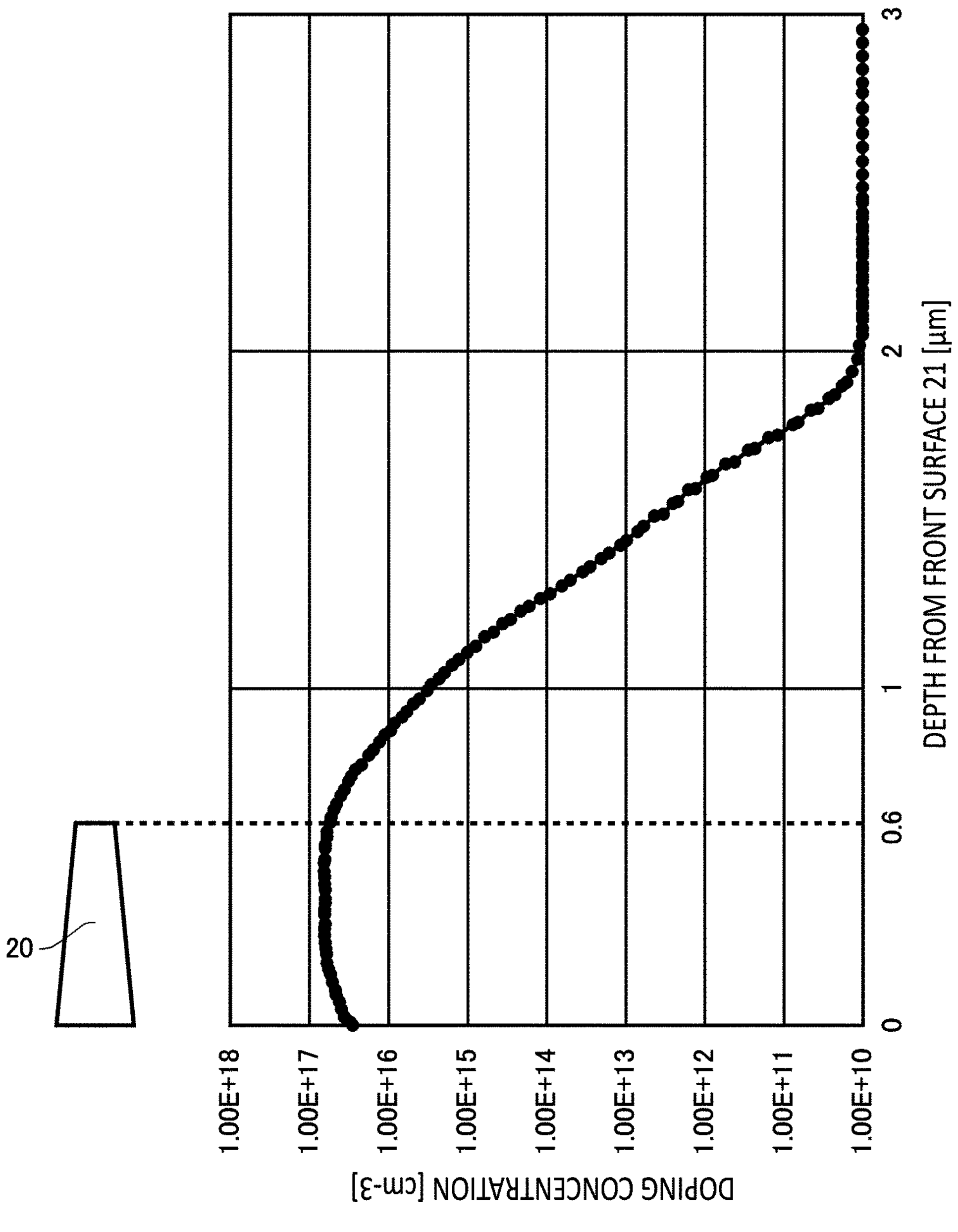
FIG. 3D shows an example of the profile of the doping concentration in the semiconductor device 100 of the example embodiment.

FIG. 3D is a graph showing the doping concentration of the anode region 19 in another example embodiment of the present example. The horizontal axis is the distance from the front surface 21 of the semiconductor substrate 10, and the vertical axis is the doping concentration. In addition, the schematic diagram of the trench contact portion 20 with a depth of 0.6 μm is shown above the graph as an example.

The example embodiment shown in FIG. 3D has a flat portion which is a substantially flat region and in which the doping concentration does not have a peak. The substantially flat region may have a variation in doping concentration within 10% in a range of 0.6 μm or more and 1.0 μm or less. The bottom portion of the trench contact portion 20 exists in a depth range where the flat portion exists. A doping concentration in the flat portion may be 1E16 $cm^{-3}$ or more and 1E17 $cm^{-3}$ or less. In the present example embodiment, a sufficient amount of doping concentrations can be secured around the bottom portion of the trench contact portion 20, and thus the value of Vf can be maintained.

It should be noted that the flat portion may be formed with a plurality of peaks of doping concentrations. For example, the doping concentration of the anode region 19 may have a plurality of peaks of doping concentrations.

Figure 4:
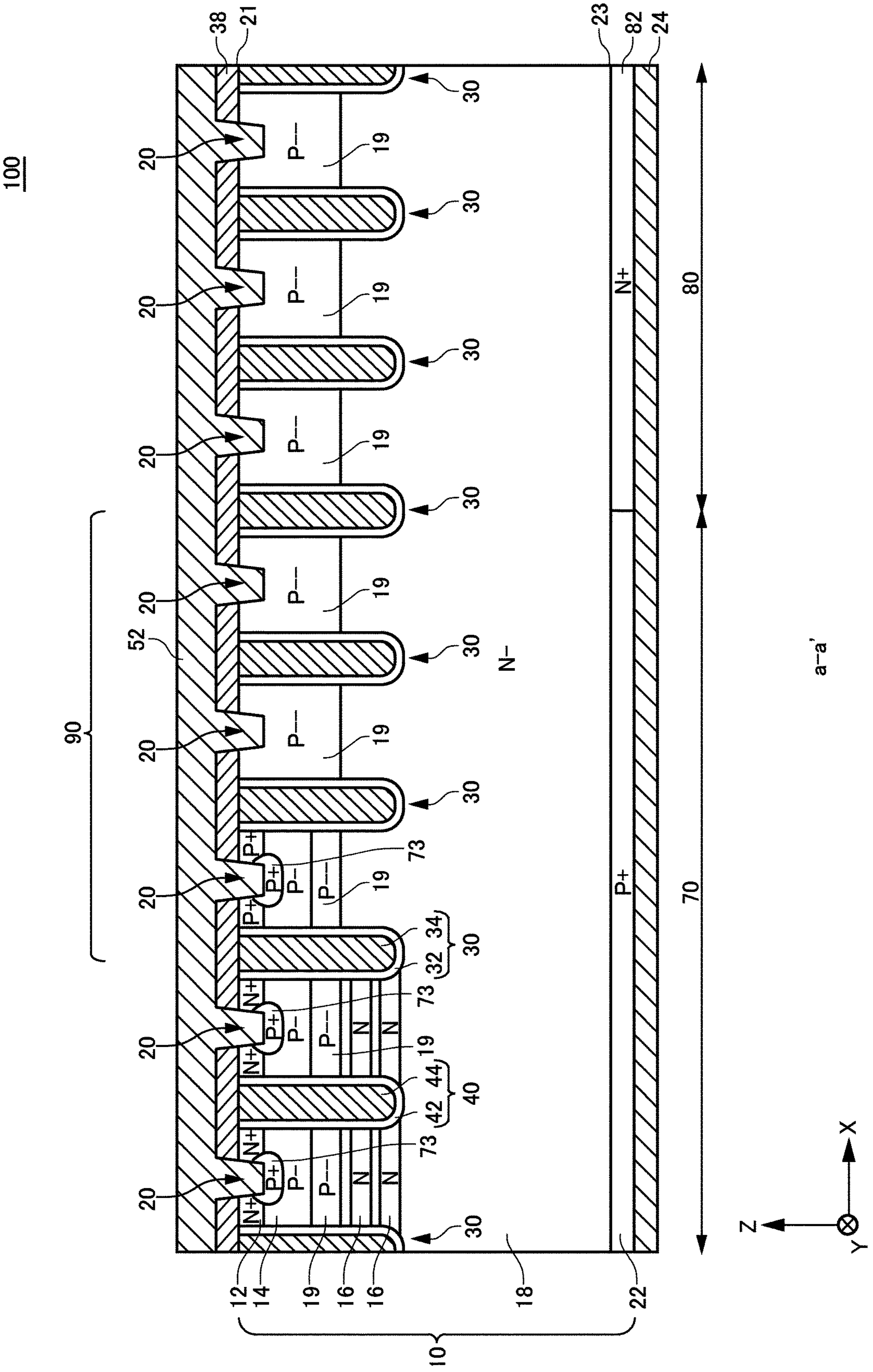
FIG. 4 shows a modification example of the cross section a-a' in FIG. 1.

FIG. 4 is a diagram showing the cross section a-a' of the semiconductor device 100 in another example embodiment of the present example. FIG. 4 particularly describes a difference from FIG. 2A.

In FIG. 2A, the depth of the lower end of the base region 14 and the depth of the lower end of the anode region 19 are the same as each other. In contrast to this, in FIG. 4, the depth of the lower end of the anode region 19 is deeper than the depth of the lower end of the base region 14. In this way, by the depth of the anode region 19 being set to be deep, it is possible to flexibly change the depths of the peak position Pp of the doping concentration and the position of the bottom portion of the trench contact portion 20.

Figure 5:
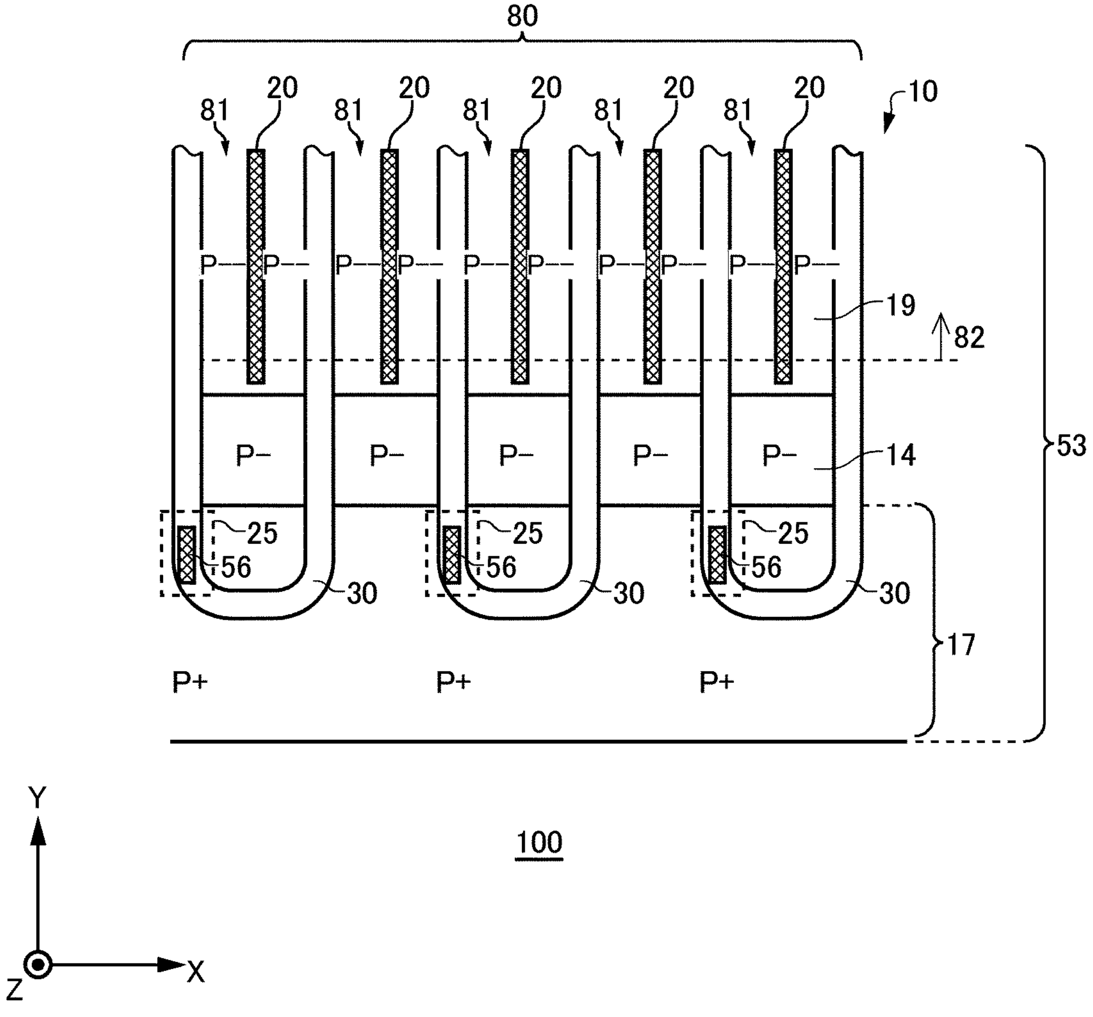
FIG. 5 shows an example of the top plan view in another example embodiment of the semiconductor device 100.

FIG. 5 is an upper surface of a modification example of the semiconductor device 100. The semiconductor device 100 of the present example includes the diode portion 80, but does not include the transistor portion 70. The diode portion 80 of the present example includes a plurality of dummy trench portions 30, but may include the gate trench portion 40. The semiconductor device 100 of the present example includes an anode electrode 53. The dummy trench portion 30 may be set to an anode potential.

The anode electrode 53 is formed of a material containing metal. At least a part of a region of the anode electrode 53 may be formed of metal such as aluminum (Al), or an alloy containing aluminum, for example, a metal alloy such as an aluminum-silicon alloy (AlSi) and an aluminum-silicon-copper alloy (AlSiCu). The anode electrode 53 may have barrier metal formed of titanium, a titanium compound, or the like in a lower layer of a region formed of aluminum or an alloy containing aluminum, or the like.

Figure 6:
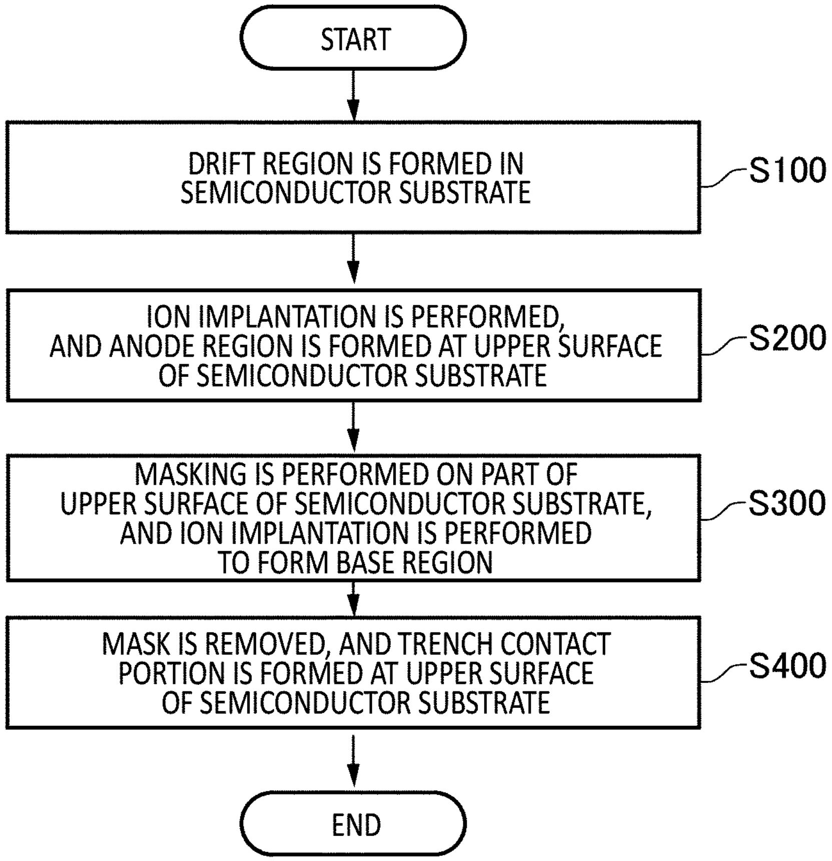
FIG. 6 shows an example of a manufacturing method for the semiconductor device 100.

FIG. 6 is a flowchart showing a manufacturing method for the semiconductor device 100. The manufacturing method includes step S100 of forming the drift region 18, step S200 of forming the anode region 19, step S300 of forming the base region 14, and step S400 of forming the trench contact portion 20.

In the step S200 of forming the anode region 19, the anode region 19 is formed by implanting the ion from the front surface 21 side of the semiconductor device 100. An acceleration voltage at a time of the ion implantation in the present example is higher than an acceleration voltage at a time of the ion implantation in the comparison example. The acceleration voltage at the time of the ion implantation in the present example may be 100 KeV or more and 650 KeV or less. By implanting the ion at an acceleration voltage higher than that in the comparison example, it is possible to form the peak of the doping concentration at a position deeper than that in the comparison example, from the front surface 21.

In addition, the implantation of the ion may be performed multiple times. The implantation of the ion may be performed by dividing the acceleration voltage into a first acceleration voltage and a second acceleration voltage. The first acceleration voltage may be lower than the second acceleration voltage. At this time, a dose amount of ions implanted in a single implantation in the comparison example, and a total dose amount of ions which are implanted in the case where the implantation is performed multiple times, may be the same as each other. A dose amount of ions which are implanted at the first acceleration voltage may be greater than a dose amount of ions which are implanted at the second acceleration voltage.

In an example, when the ion is implanted at the first acceleration voltage, the peak position of the doping concentration may be set to be 0.3 μm or more and 1.0 μm or less from the front surface 21 before an annealing process. In addition, when the ion is implanted at the second acceleration voltage, the peak position of the doping concentration may be set to be 0.8 μm or more and 1.5 μm or less from the front surface 21 before the annealing process. As an example, when the ion is implanted at an acceleration voltage of 400 KeV, the peak of the doping concentration can be arranged at a position of 0.8 μm from the front surface 21, and when the ion is implanted at an acceleration voltage of 650 KeV, the peak of the doping concentration can be arranged at a position of 1.3 μm from the front surface 21.

In an example, the implantation of the ion may be performed two times by dividing the acceleration voltage into 400 KeV and 650 KeV. In addition, a dose amount of ions which are implanted at the acceleration voltage of 400 Key may be greater than a dose amount of ions which are implanted at the acceleration voltage of 650 KeV. Performing the implantation multiple times makes it possible to form a doping concentration profile having the flat region as shown in FIG. 3D.

Then, in the step S300, masking is performed on the upper surface of the semiconductor substrate 10, and an additional ion implantation is performed to selectively form the base region 14. A mask may be any mask such as a photoresist. The additional ion implantation may also be performed at an acceleration voltage higher than that in the comparison example. This makes it possible to form the base region 14 only in a part of the region of the transistor portion 70. In addition, it is possible to set the doping concentration of the base region 14 to be higher than the doping concentration of the anode region 19. The ion implantation in S300 may also be performed multiple times.

Then, in the step S400, the mask is removed and the interlayer dielectric film 38 is formed, and then, the trench contact portion 20 is formed. The step of forming the trench contact portion 20 and the step of forming the interlayer dielectric film 38 may be reversed in order. That is, the interlayer dielectric film 38 may be formed after the trench contact portion 20 is formed.

Subsequently, by implanting the ion into the bottom portion of the trench contact portion 20, the transistor plug region 73 and the diode plug region 83 are formed. The ion which is implanted is B and BF 2 in an example.

While the present invention has been described above by using the embodiments, the technical scope of the present invention is not limited to the scope of the claims according to the above-described embodiments. It is apparent to persons skilled in the art that various alterations or improvements can be added to the above-described embodiments. It is also apparent from the description of the claims that the embodiment to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: semiconductor substrate, 12: emitter region, 14: base region, 15: contact region, 16: accumulation region, 17: well region, 18: drift region, 19: anode region, 20: trench contact portion, 21: front surface, 22: collector region, 23: back surface, 24: collector electrode, 30: dummy trench portion, 31: extension part, 32: dummy dielectric film, 33: connection part, 34: dummy conductive portion, 38: interlayer dielectric film, 40: gate trench portion, 41: extension part, 42 gate dielectric film, 43: connection part, 44: gate conductive portion, 52 emitter electrode, 53: anode electrode, contact hole, 56 contact hole, 70: transistor portion, 71: mesa portion, 73: transistor plug region, diode portion, 81 mesa portion, 82: cathode region, 181: first cathode portion, 182: second cathode portion, 83: diode plug region, 90: boundary portion, 91: mesa portion, 92: mesa portion, 100: semiconductor device.

What is claimed is:

1. A semiconductor device that includes a diode portion, the semiconductor device comprising:
- a drift region of a first conductivity type provided in a semiconductor substrate;
- an anode region of a second conductivity type provided to be closer to a front surface side of the semiconductor substrate than the drift region; and
- a trench contact portion provided at the front surface of the semiconductor substrate in the diode portion, wherein
- in a depth direction of the semiconductor substrate, a doping concentration of the anode region at a same depth as that of a bottom portion of the trench contact portion is 1E16 $cm^{-3}$ or more and 1E17 $cm^{-3}$ or less,
- a depth of a lower end of the trench contact portion is 0.3 μm or more and 0.6 μm or less from the front surface of the semiconductor substrate.

2. The semiconductor device according to claim 1, wherein
- the anode region has a peak of the doping concentration in the depth direction of the semiconductor substrate, and
- the bottom portion of the trench contact portion is closer to the front surface side than the peak of the doping concentration of the anode region, in the depth direction of the semiconductor substrate.

3. The semiconductor device according to claim 2, wherein the anode region has a positive slope of the doping concentration at the same depth as that of the bottom portion of the trench contact portion in the depth direction of the semiconductor substrate.

4. The semiconductor device according to claim 3, wherein the positive slope of the doping concentration is 4E16 $cm^{-3}$/μm or more.

5. The semiconductor device according to claim 1, wherein the anode region has a thickness of 0.6 μm or more and 3.0 μm or less in the depth direction of the semiconductor substrate, and has a flat portion with a doping concentration of 1E16 $cm^{-3}$ or more and 1E17 $cm^{-3}$ or less.

6. The semiconductor device according to claim 1, comprising a diode plug region of the second conductivity type which is selectively provided in an extension direction of a trench below the bottom portion of the trench contact portion and which has a doping concentration higher than that of the anode region.

7. The semiconductor device according to claim 6, wherein
- the diode portion includes a cathode region of the first conductivity type which has a doping concentration higher than that of the drift region on a back surface of the semiconductor substrate, and
- the cathode region includes a first cathode portion of the first conductivity type and a second cathode portion of the second conductivity type.

8. The semiconductor device according to claim 1, further comprising:
- a transistor portion, wherein
- the transistor portion has
  - an emitter region of the first conductivity type which is provided above the drift region and which has a doping concentration higher than that of the drift region, and
  - a base region of the second conductivity type provided above the drift region, and
- the doping concentration of the anode region is lower than a doping concentration of the base region.

9. The semiconductor device according to claim 2, further comprising:
- a transistor portion, wherein
- the transistor portion has
  - an emitter region of the first conductivity type which is provided above the drift region and which has a doping concentration higher than that of the drift region, and
  - a base region of the second conductivity type provided above the drift region, and
- the doping concentration of the anode region is lower than a doping concentration of the base region.

10. The semiconductor device according to claim 8, wherein a lower end of the anode region has a same depth as a lower end of the base region, in the depth direction of the semiconductor substrate.

11. The semiconductor device according to claim 8, wherein a lower end of the anode region is deeper than a lower end of the base region, in the depth direction of the semiconductor substrate.

12. The semiconductor device according to claim 8, comprising a transistor plug region of the second conductivity type which is provided to extend in an extension direction of a trench in the bottom portion of the trench contact portion and which has a doping concentration higher than that of the anode region, in the transistor portion.

13. The semiconductor device according to claim 8, further comprising:
- a boundary portion which has the anode region in the front surface side of the semiconductor substrate and which has a collector region of the second conductivity type on a back surface side of the semiconductor substrate, in the transistor portion, wherein
- the boundary portion has the trench contact portion provided at the front surface of the semiconductor substrate.

14. The semiconductor device according to claim 13, wherein in the boundary portion,
- a transistor plug region of the second conductivity type provided to extend in an extension direction of a trench in the bottom portion of the trench contact portion, in a mesa portion adjacent to the transistor portion, and
- a diode plug region of the second conductivity type selectively provided in an extension direction of a trench in the bottom portion of the trench contact portion, in a mesa portion adjacent to the diode portion.

15. The semiconductor device according to claim 13, wherein the boundary portion has one or more dummy trench portions set to a potential different from a gate potential.

* * * * *